United States Patent
Yoshida et al.

(10) Patent No.: US 7,344,976 B2
(45) Date of Patent: Mar. 18, 2008

(54) METHOD FOR FABRICATING NONVOLATILE SEMICONDUCTOR MEMORY DEVICE

(75) Inventors: Hiroshi Yoshida, Osaka (JP); Takumi Mikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 11/377,452

(22) Filed: Mar. 17, 2006

(65) Prior Publication Data

US 2006/0286720 A1    Dec. 21, 2006

(30) Foreign Application Priority Data

Jun. 17, 2005    (JP) .............................. 2005/177254

(51) Int. Cl.
*H01L 21/4763*    (2006.01)
(52) U.S. Cl. .................. 438/639; 438/618; 438/628; 438/637; 438/672; 257/E21.575; 257/E21.577
(58) Field of Classification Search ..................... None
See application file for complete search history.

(56) References Cited

U.S. PATENT DOCUMENTS

| | | | |
|---|---|---|---|
| 5,470,789 A * | 11/1995 | Misawa | ...................... 438/643 |
| 6,440,840 B1 * | 8/2002 | Chen | ........................... 438/624 |
| 2001/0022293 A1 * | 9/2001 | Maeda et al. | .................. 216/67 |
| 2001/0048162 A1 * | 12/2001 | Haruhana et al. | ............ 257/751 |
| 2004/0089920 A1 * | 5/2004 | Joshi et al. | .................. 257/629 |

FOREIGN PATENT DOCUMENTS

| | | |
|---|---|---|
| JP | 9-17787 A | 1/1997 |
| JP | 2001-7303 A | 1/2001 |

* cited by examiner

*Primary Examiner*—Michael Lebentritt
*Assistant Examiner*—Cheung Lee
(74) *Attorney, Agent, or Firm*—McDermott Will & Emery LLP

(57) ABSTRACT

An adhesion layer composed of a titanium film and a titanium nitride film is formed by CVD on the inner wall of a contact hole formed in a multilayer film composed of an interlayer insulating film, a silicon nitride film, and a silicon dioxide film. Then, a conductive film made of tungsten or polysilicon is filled by CVD in the contact hole and the respective portions of the conductive film and the adhesion layer which are located over the silicon dioxide film are removed by CMP. Subsequently, the silicon dioxide film is removed by an etch-back method or a CMP method so that the silicon nitride film is exposed. This can prevent the delamination of the adhesion layer from the silicon nitride film as a hydrogen barrier film and also prevent the formation of a scratch in the silicon nitride film.

16 Claims, 3 Drawing Sheets

METHOD FOR FABRICATING NONVOLATILE SEMICONDUCTOR MEMORY DEVICE

CROSS-REFERENCE TO RELATED APPLICATIONS

The teachings of Japanese Patent Application JP 2005-177254, filed Jun. 17, 2005, are entirely incorporated herein by reference, inclusive of the claims, specification, and drawings.

BACKGROUND OF THE INVENTION

The present invention relates to a method for fabricating a nonvolatile semiconductor memory device having a capacitor element using a ferroelectric film or a high-dielectric-constant film.

A ferroelectric memory using a ferroelectric film as a capacitor insulating film is one of nonvolatile memories. The most characteristic feature of the ferroelectric memory is that it continues to retain information once it is written, which is different from a DRAM as a typical common memory. The ferroelectric memory is also used as an embedded memory in a system LSI. The ferroelectric memory has performance advantages over a flash memory in terms of low-voltage and high-speed operation, the number of rewritable times can be rewritten, high reliability, and the like.

A description will be given herein below to a method for fabricating a semiconductor device having a conventional ferroelectric memory with reference to FIGS. 5A to 5E. FIGS. 5A to 5E are cross-sectional views showing the process steps of the conventional method for fabricating the semiconductor device.

As shown in FIG. 5A, an interlayer insulating film 1004 composed of a silicon dioxide film and a hydrogen barrier film 1005 for preventing the diffusion of hydrogen are deposited on a semiconductor substrate 1000 formed with a transistor 1001. Then, a contact hole 1006 reaching the semiconductor substrate 1000 is formed in each of the interlayer insulating film 1004 and the hydrogen barrier film 1005.

Next, as shown in FIG. 5B, an adhesion layer 1007 composed of a multilayer film of a titanium film and a titanium nitride film is formed on the inner surface of the contact hole 1006. Subsequently, as shown in FIG. 5C, a contact plug material 1008 is filled in the contact hole 1006. Next, as shown in FIG. 5D, the portions of the contact plug material 1008 and the adhesion layer 1007 which are located over the upper surface of the hydrogen barrier film 1005 are removed by CMP, whereby a contact plug 1009 is formed (see, e.g., Japanese Laid-Open Patent Publication No. HEI 9-17787).

Then, as shown in FIG. 5E, a capacitor element comprising: a lower electrode 1010 connected to the contact plug 1009; a capacitor insulating film 1011 composed a ferroelectric film; and an upper electrode 1012 is formed on the hydrogen barrier film 1005.

Because the ferroelectric material is reduced by hydrogen generated in the LSI steps, the characteristics of the ferroelectric memory are thereby degraded. To counter this, the ferroelectric memory thus uses the structure in which the hydrogen barrier film 1005 is provided on the interlayer insulating film 1004 to prevent the diffusion of hydrogen in a direction from the substrate (see, e.g., Japanese Laid-Open Patent Publication No. 2001-7303).

SUMMARY OF THE INVENTION

The conventional method for fabricating the semiconductor device described above is different from a method for forming a contact plug for a typical LSI in that the contact plug 1009 is formed in the multilayer film of the interlayer insulating film 1004 composed of the silicon dioxide film and the hydrogen barrier film 1005. As a result, when a silicon nitride is used as the material of the hydrogen barrier film 1005 mentioned above, the problem is encountered that the adhesion layer 1007 on the hydrogen barrier film 1005 delaminates therefrom in the step of filling tungsten or polysilicon, used as the contact plug material 1008, in the contact hole 1006 having the adhesion layer 1007 formed by CVD on the inner surface thereof. Such a delaminated adhesion layer becomes the source of particles generated in a CVD system and thereby causes the problem of a reduced product yield.

In addition, since the contact plug material and the adhesion layer are polished by CMP till the hydrogen barrier film 1005 is exposed in the step of forming the contact plug 1009 shown in FIG. 5D, the surface of the hydrogen barrier film 1005 is also over-polished. At this time, a scratch is formed in the surface of the hydrogen barrier film 1005 by the over-polishing and a crack resulting from the scratch is formed in the subsequent steps, which leads to the problem of the degradation of the barrier property of the hydrogen barrier film.

In view of the foregoing problems, it is therefore an object of the present invention to prevent the delamination of the adhesion layer for the contact plug from the hydrogen barrier film made of a silicon nitride, suppress the degradation of the barrier property of the hydrogen barrier film, and thereby provide a method for fabricating a nonvolatile semiconductor memory device with an improved productivity.

To solve the problems described above, a method for fabricating a nonvolatile semiconductor memory device according to the present invention comprises the steps of: forming, on a substrate, a multilayer film comprising an interlayer insulating film, a silicon nitride film as a hydrogen barrier film, and a silicon dioxide film; forming, in the multilayer film, a contact hole reaching the substrate; forming an adhesion layer on an inner surface of the contact hole and then filling a conductive film in the contact hole; and removing respective portions of the conductive film, the adhesion layer, and the silicon dioxide film which are located over the silicon nitride film and forming a contact plug in plug in the contact hole.

Since the contact hole is thus formed in the multilayer film comprising the interlayer insulating film, the silicon nitride film, and the silicon dioxide film, the portion of the adhesion layer which is located outside the contact hole is formed on the silicon dioxide film. This prevents the delamination of the adhesion layer from the silicon dioxide film during the filling of the conductive film in the step of forming the contact plug and thereby allows an improvement in yield.

Preferably, the respective portions of the conductive film and the adhesion layer which are located over the silicon dioxide film are removed by using a CMP method. Since the silicon nitride film is covered with the silicon dioxide film, the silicon nitride film is not polished in the step of removing the respective portions of the conductive film and the adhesion layer by using the CMP method. As a result, a scratch is not formed in the surface of the silicon nitride film and the degradation of the hydrogen barrier property of the silicon nitride film can be thereby prevented.

In the fabrication method described above, an etching selectivity of the silicon dioxide film to the silicon nitride film is preferably higher than 1. When the selectivity of the silicon dioxide film to the silicon nitride film is high, the conductive film can be left efficiently only within the contact hole. Since the selectivity of the silicon dioxide film to the silicon nitride film is high, an amount of the portion of the silicon nitride film reduced by a CMP process or an etch-back process can be reduced. This allows the hydrogen barrier property of the silicon nitride film to be retained and also allows the surface planarity of the substrate to be improved.

In the fabrication method described above, an end time of the etching of the silicon dioxide film is preferably controlled by detecting plasma light emission from the silicon nitride film or from the silicon dioxide film. By thus detecting the etching end time, the amount of the portion of the silicon nitride film reduced by the etching process can be reduced. This allows the hydrogen barrier property of the silicon nitride film to be retained.

In the fabrication method described above, when the respective portions of the conductive film and the adhesion layer which are located over the silicon dioxide film are removed, a recess from a surface of the silicon dioxide film is preferably formed over the contact plug has and a depth of the recess is preferably smaller than a thickness of the silicon dioxide film. By thus estimating the depth of the recess formed through the removal of the respective portions of the conductive film and the adhesion layer and setting the thickness of the silicon dioxide film such that it is equal to the depth of the recess, the recess can also be removed simultaneously with the removal of the silicon dioxide film. As a result, the upper surface of the contact plug is substantially flush with the upper surface of the silicon nitride film. This allows the formation of a stable capacitor element over the contact plug and the silicon nitride film.

Thus, the present invention forms the contact hole in the multilayer film including the silicon nitride film and the silicon dioxide film as the upper layer and fills the adhesion layer and the conductive film in the contact hole to form the contact plug. This can prevent the delamination of the adhesion layer from the silicon nitride film as the hydrogen barrier film and can also prevent the formation of a scratch in the silicon nitride film. Accordingly, it becomes possible to prevent the degradation of the barrier property of the silicon nitride film and improve the productivity.

DETAILED DESCRIPTION OF THE INVENTION

Figure 1A:
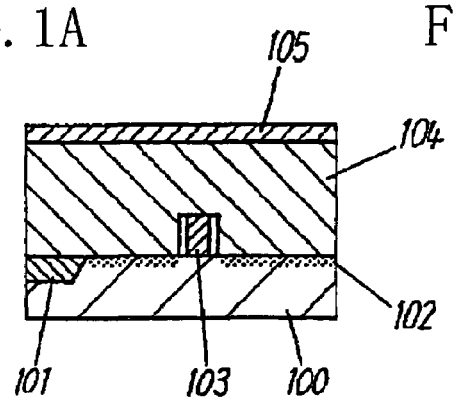
FIG. 1A to 1F are cross-sectional views showing the process steps of a method for fabricating a semiconductor device according to a first embodiment of the present invention.

Referring now to the drawings, the embodiments of the present invention will be described herein below.

Embodiment 1

A description will be given to the first embodiment of the present embodiment with reference to FIGS. 1A to 1F and FIGS. 2A and 2B. FIGS. 1A to 1F and FIGS. 2A and 2B are cross-sectional views showing the process steps of a method for fabricating a semiconductor device according to the first embodiment.

As shown in FIG. 1A, the method for fabricating a semiconductor device according to the first embodiment selectively forms an isolation layer 101 in a semiconductor substrate 100 and forms a transistor composed of impurity diffusion layers 102 and a gate electrode 103. Then, as also shown in FIG. 1A, an interlayer insulating film 104 with a thickness of about 1000 nm and a silicon nitride film 105 with a thickness of about 150 nm are deposited successively in an ascending order over the entire surface of the semiconductor substrate 100. The silicon nitride film 105 functions as a hydrogen barrier film for preventing the undesirable diffusion of hydrogen generated in the subsequent steps into a capacitance insulating film 110.

Figure 1B:
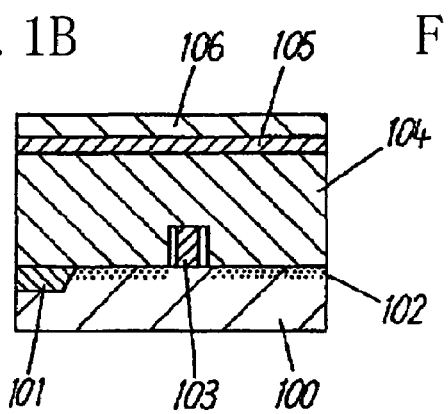
Figure 1C:
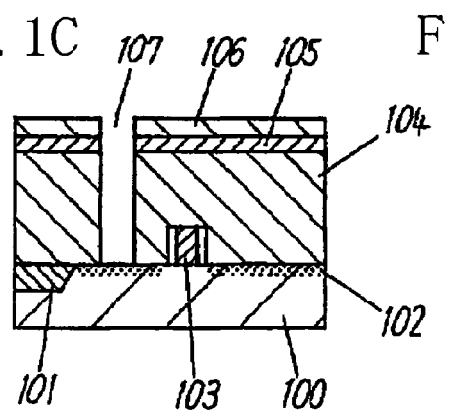

Next, as shown in FIG. 1B, a silicon dioxide film 106 with a thickness of about 100 nm is formed on the silicon nitride film 105. Subsequently, as shown in FIG. 1C, a contact hole 107 reaching one of the impurity diffusion layers is formed in a multilayer film composed of the interlayer insulating film 104, the silicon nitride film 105, and the silicon dioxide film 106.

Figure 1D:
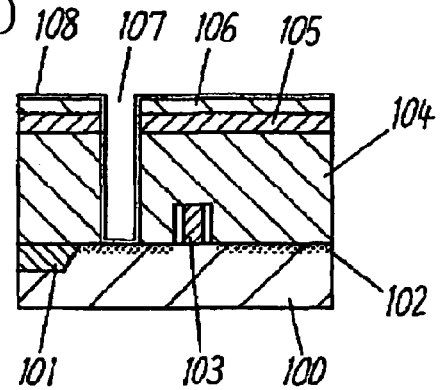

Next, as shown in FIG. 1D, an adhesion layer 108 is formed by CVD over the surface of the semiconductor substrate 100 including the inner wall of the contact hole 107. The adhesion layer 108 is composed herein of a titanium film and a titanium nitride film formed successively in an ascending order.

Figure 1E:
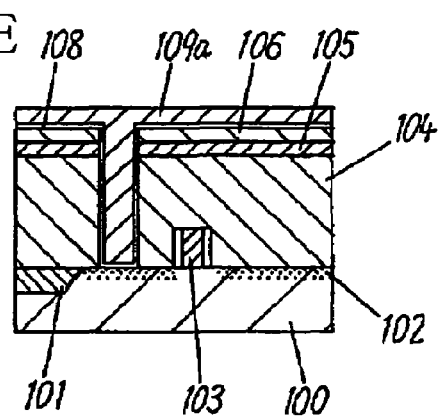
Figure 1F:
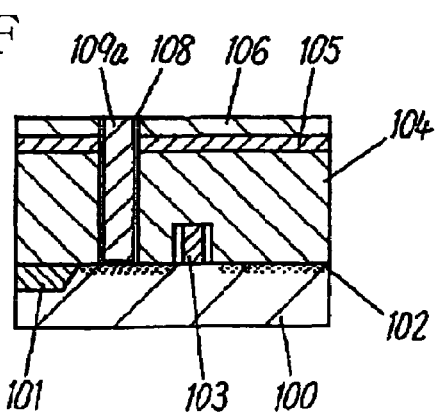

Subsequently, as shown in FIG. 1E, a conductive film 109a made of tungsten or polysilicon is formed by CVD in such a manner as to cover the entire surface of the semiconductor substrate 100 and fill in the contact hole 107. Then, as shown in FIG 1F, the respective portions of the conductive film 109a and the adhesion layer 108 which are located over the silicon dioxide film 106 are removed by chemical mechanical polishing (hereinafter referred to as CMP) method.

Figure 2A:
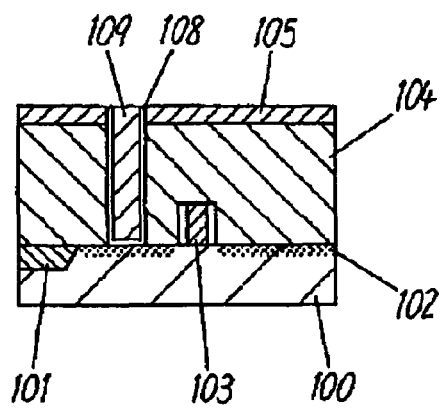
FIGS. 2A and 2B are cross-sectional views showing the process steps of the method for fabricating a semiconductor device according to the first embodiment.

Next, as shown in FIG. 2A, the silicon dioxide film 106 is removed by an etching (etch-back) method or a CMP method such that the silicon nitride film 105 is exposed, whereby a contact plug 109 reaching the semiconductor substrate 100 is formed.

In the case where the etch-back method is used to remove the silicon dioxide film 106, the end time of etching is detected by using plasma light emission resulting from the silicon nitride film 105 or the silicon dioxide film 106 which occurs when etching is performed. This can reduce an amount of the portion of the silicon nitride film 105 reduced by etching and suppress the degradation of the hydrogen barrier characteristic of the silicon nitride film 105.

Since the surface of the silicon nitride film 105 is thus exposed, a lower electrode can be formed on the silicon nitride film 105 in the subsequent steps without intervention of the silicon dioxide film 106 and the path of hydrogen diffused from below the capacitor element into the capacitor element can be cut off. This can prevent the situation in which the ferroelectric film is reduced by hydrogen generated in each of the steps and the ferroelectric property is thereby degraded and improve the reliability of the ferroelectric memory.

Figure 2B:
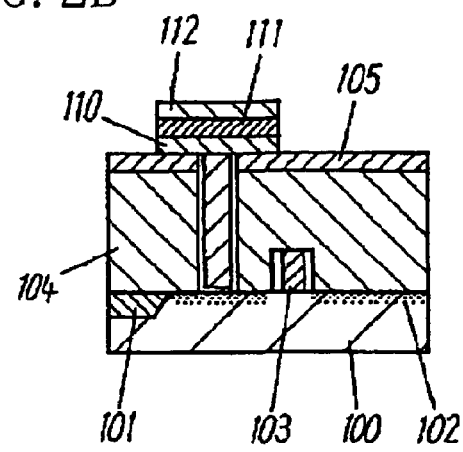

Subsequently, as shown in FIG. 2B, a lower electrode 110 connected to the contact plug 110, a capacitor insulating film 111 composed of a ferroelectric film, and an upper electrode 112 are formed successively by etching on the silicon nitride film 105 so that a capacitor element composed of the lower electrode 110, the capacitor insulating film 111, and the upper electrode 112 is formed.

The lower electrode 110 has a multilayer structure in which the lowermost layer connected to the contact plug 109 is a conductive hydrogen barrier film composed of, e.g., a TiN film or a TiAlN film. On the other hand, the uppermost layer connected to the capacitor insulating film 111 is composed of, e.g., a Pt film or an $IrO_2$ film. The upper electrode 112 is composed of a film containing Pt or an $IrO_2$.

The capacitor insulating film 111 is composed of a ferroelectric film made of any one of $SrBi_2(Ta_xNb_{1-x})_2O_9$, $Pb(Zr_xTi_{1-x})O_3$, $(Ba_xSr_{1-x})TiO_3$, and $(Bi_xLa_{1-x})_4Ti_3O_{12}$ (in each of which x satisfies $0 \leq x \leq 1$).

Thus, as shown in FIG. 1E, the present invention has formed the silicon dioxide film on the silicon nitride film and provided the contact hole in the multilayer film so that the adhesion layer is formed on the second silicon dioxide film. As a result, the delamination of the adhesion layer formed in the contact hole from the silicon nitride film does not occur. This is because the adherence between the titanium film composing the adhesion layer and the silicon dioxide film is more excellent than the adherence between the titanium film and the silicon nitride film. A description will be given herein below to the cause of the delamination. When tungsten is deposited by CVD in the contact hole in which the adhesion layer is formed directly on the silicon nitride film as in the conventional embodiment, a temperature increase during the deposition of tungsten causes a stress to be applied to the silicon nitride film so that the adhesion layer delaminates from the surface of the peripheral portion of the opening of the contact hole.

A description will be given next to the setting of the thickness of the silicon nitride film 105 and selectivity in the polishing of the silicon dioxide film 106. In the step of forming the lower electrode 110 by etching described with reference to FIG. 2B, the silicon nitride film 105 is over-etched by an amount corresponding to a thickness of about 50 to 80 nm. Accordingly, the thickness of the nitride film 105 should be set in consideration of over-etching prior to the step of forming the lower electrode 110. In addition, the silicon nitride film 105 should have a thickness of about 30 nm or more to sufficiently exert the function as the hydrogen barrier. Therefore, in consideration of the over-etching during the formation of the lower electrode 110, a preferred thickness of the silicon nitride film 105 in FIG. 1A is about 110 nm.

If the thickness of the silicon dioxide film is $100 \text{ nm} \pm 15\%$, the selectivity of the silicon dioxide film to the silicon nitride film is preferably 1.2 or more. This allows a reduction in the amount of the portion of the silicon dioxide film 105 reduced by the over-etching or over-polishing of the silicon dioxide film in the step of forming the contact plug 109.

Thus, when the silicon dioxide film is removed, the etch-back method is used preferably as a removal method which provides conditions including a higher selectivity of the silicon dioxide film to the silicon nitride film. The reason for this will be described herein below. If the surface planarity of the deposited silicon dioxide film 106 is poor in FIG. 1B, a larger part of the silicon nitride film 105 is removed through the removal of the silicon dioxide film 106 in FIG. 2A so that the in-plane planarity of the interlayer insulating film 104 is degraded.

In addition, because the silicon dioxide film 106 underlying the conductive film 109a and the adhesion layer 108 is also polished to a degree during the removal of the conductive film 109a and the adhesion layer 108, larger in-plane variations are observed in the thickness of the silicon dioxide film 106 after polishing than before polishing. Accordingly, if the silicon dioxide film 106 has a center thickness of 100 nm and in-plane variations of ±15% after the formation of the contact plug 109, the difference between the maximum and minimum values of the film thickness is about 30 nm.

Therefore, if the selectivity of the silicon dioxide film to the silicon nitride film is assumed to be 1, the difference between the maximum and minimum values of the in-plane thickness of the silicon nitride film 105 is about 30 nm. That is, the in-plane variations in the thickness of the silicon dioxide film 106 are reflected directly on the in-plane variations in the thickness of the silicon nitride film 105.

On the other hand, if the selectivity of the silicon dioxide film to the silicon nitride film is assumed to be less than 1, the difference between the maximum and minimum values of the thickness of the silicon nitride film is larger than 30 nm after the silicon dioxide film 106 has been removed. That is, variations not less than the order of the in-plane variations in the thickness of the silicon dioxide film 106 occur in the thickness of the silicon nitride film 105.

Thus, when the selectivity of the silicon dioxide film to the silicon nitride film is larger than 1, the difference between the maximum and minimum values in the thickness of the silicon nitride film 105 after the removal of the silicon dioxide film 106 is smaller than 30 nm. Accordingly, a higher selectivity of the silicon dioxide film to the silicon nitride film is preferred. If the selectivity is assumed to be 10, the difference between the maximum and minimum values of the thickness of the silicon nitride film after the complete removal of the silicon dioxide film is 3 nm or less. This allows the interlayer insulating film 104 to retain the surface planarity.

As an etching method which provides a higher selectivity of the silicon dioxide film to the silicon nitride film, the use of $C_4F_8$, $CF_4$, Ar, or $O_2$ for an etching gas is preferred.

Embodiment 2

Figure 3A:
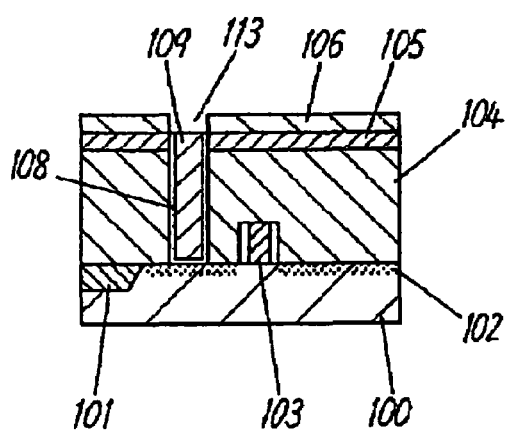
FIGS. 3A and 3B are cross-sectional views showing the process steps of a method for fabricating a semiconductor device according to a second embodiment of the present invention.
Figure 3B:
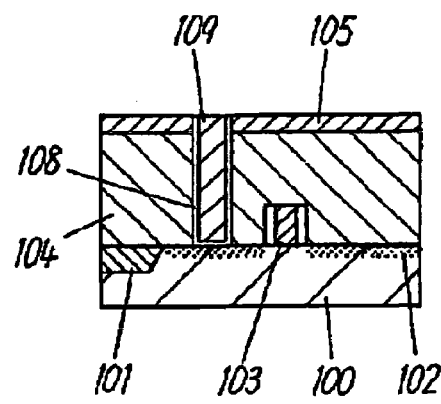

A description will be given to the second embodiment of the present invention with reference to FIGS. 3A and 3B. As for the parts of the second embodiment which are the same as those of the first embodiment, the detailed description thereof will be omitted. FIGS. 3A and 3B are cross-sectional views showing the process steps of a method for fabricating a semiconductor device according to the second embodiment. The description of the same components as shown in FIGS. 1 and 2 will be omitted by retaining the same reference numerals.

The method for fabricating a semiconductor device according to the second embodiment prior to the process step shown in FIG. 3A is the same as that according to the first embodiment shown in FIGS. 1A to 1E. Subsequently, as shown in FIG. 3A, the portions of the conductive film 109a and the adhesion layer 108 which are located over the silicon dioxide film 106 are removed by CMP, whereby the adhesion layer 108 and the contact plug 108 are formed in the contact hole 107. As shown in FIG. 3A, a recess 113 at a depth of about 30 to 40 nm is formed over the contact plug 109 by the polishing step using a CMP method described above.

Next, as shown in FIG. 3B, the portion of the silicon dioxide film 106 which corresponds to the depth of the recess 113 is removed by an etch-back method or a CMP method. The subsequent steps are the same as shown in FIGS. 2A and 2B so that the description thereof will be omitted.

After the recess 113 has thus been removed, the lower electrode, the capacitor insulating film, and the upper electrode are formed on the silicon nitride film 105 with excellent planarity. This allows the prevention of the delamination of the lower electrode from the contact plug during the crystallization annealing of the capacitor insulating film.

Figure 4:
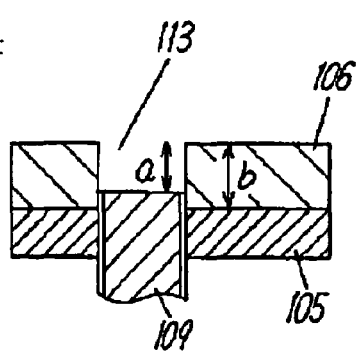
FIG. 4 is a view illustrating a recess in the second embodiment.
Figure 5A:
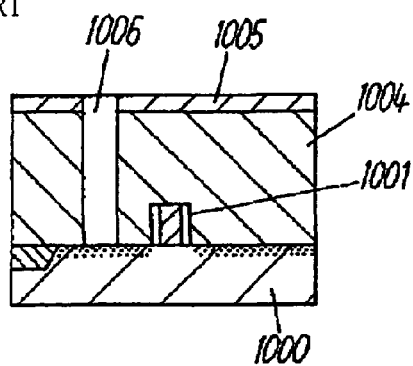
FIGS. 5A to 5E are cross-sectional views illustrating a method for fabricating a semiconductor device having a conventional ferroelectric memory.
Figure 5D:
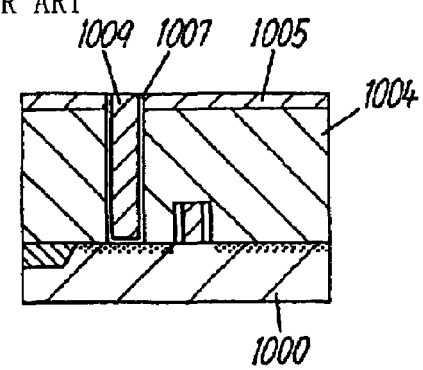
Figure 5B:
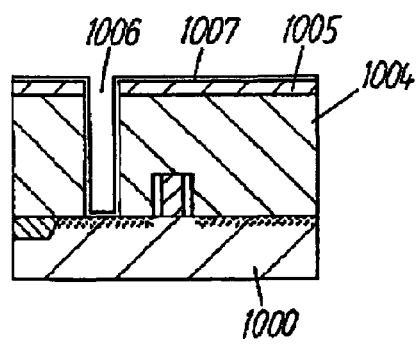
Figure 5E:
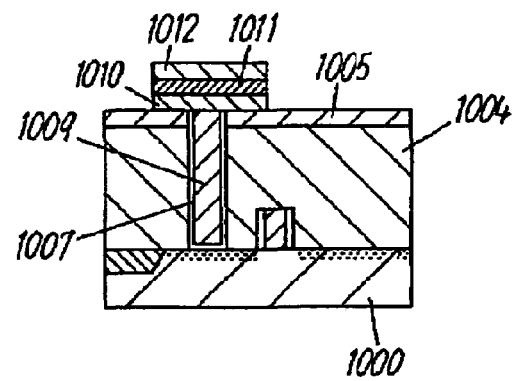
Figure 5C:
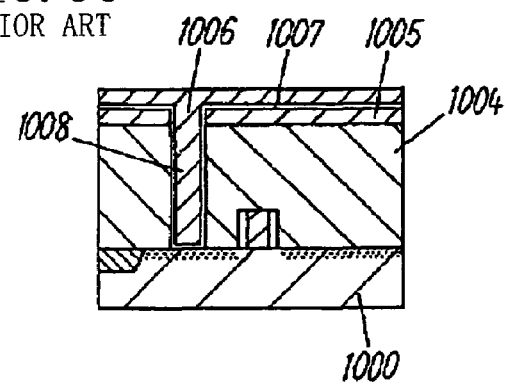

A description will be given to the setting of the thickness of the silicon dioxide film according to the present embodiment with reference to FIG. 4. FIG. 4 is a cross-sectional view of the principal portion of a recess in which the upper portion of the contact plug has been enlarged. In FIG. 4, the thickness b of the silicon dioxide film 106 is preferably set to be equal, to the depth a of the recess 113. This allows simultaneously removal of the silicon dioxide film 106 and the recess 113.

Thus, the method for fabricating a semiconductor device according to the present invention is useful for the process steps of forming a contact plug by using a CVD method.

What is claimed is:

1. A method for fabricating a nonvolatile semiconductor memory device, the method comprising the steps of:
   (a) forming, on a substrate, a multilayer film comprising an interlayer insulating film, a silicon nitride film as a hydrogen barrier film, and a silicon dioxide film;
   (b) forming, in the multilayer film, a contact hole reaching the substrate;
   (c) forming an adhesion layer on an inner surface of the contact hole and then filling a conductive film in the contact hole; and
   (d) removing respective portions of the conductive film, the adhesion layer, and the silicon dioxide film which are located over the silicon nitride film and forming a contact plug in the contact hole,
   wherein, after the step (d), a remaining thickness of the silicon nitride film is not less than 30 nm.

2. The method of claim 1, wherein the step (d) includes the step of removing the respective portions of the conductive film and the adhesion layer which are located over the silicon dioxide film by using a CMP method.

3. The method of claim 2, further comprising the step of:
   removing the silicon dioxide film on the silicon nitride film by using an etching method.

4. The method of claim 3, wherein an etching selectivity of the silicon dioxide film to the silicon nitride film is higher than 1.

5. The method of claim 3, further comprising the step of:
   detecting plasma light emission from the silicon nitride film or from the silicon dioxide film and thereby controlling an end time of the etching of the silicon dioxide film.

6. The method of claim 1, wherein the conductive film is made of tungsten or polysilicon.

7. The method of claim 1, wherein the adhesion layer is a multilayer film comprising a titanium film and a titanium nitride film.

8. The method of claim 1, further comprising the step of:
   forming, on the silicon nitride film, a ferroelectric capacitor having a lower electrode connected to the contact plug.

9. A method for fabricating a nonvolatile semiconductor memory device, the method comprising the steps of:
   (a) forming, on a substrate, a multilayer film comprising an interlayer insulating film, a silicon nitride film as a hydrogen barrier film, and a silicon dioxide film;
   (b) forming, in the multilayer film, a contact hole reaching the substrate;
   (c) forming an adhesion layer on an inner surface of the contact hole and then filling a conductive film in the contact hole; and
   (d) removing respective portions of the conductive film, the adhesion layer, and the silicon dioxide film which are located over the silicon nitride film and forming a contact plug in the contact hole,
   wherein, when the respective portions of the conductive film and the adhesion layer which are located over the silicon dioxide film are removed in the step (d), a recess from a surface of the silicon dioxide film is formed over the contact plug and a depth of the recess is smaller than a thickness of the silicon dioxide film.

10. The method of claim 9, wherein the step (d) includes the step of removing the respective portions of the conductive film and the adhesion layer which are located over the silicon dioxide film by using a CMP method.

11. The method of claim 10, further comprising the step of:
    removing the silicon dioxide film on the silicon nitride film by using an etching method.

12. The method of claim 11, wherein an etching selectivity of the silicon dioxide film to the silicon nitride film is higher than 1.

13. The method of claim 11, further comprising the step of:
    detecting plasma light emission from the silicon nitride film or from the silicon dioxide film and thereby controlling an end time of the etching of the silicon dioxide film.

14. The method of claim 9, wherein the conductive film is made of tungsten or polysilicon.

15. The method of claim 9, wherein the adhesion layer is a multilayer film comprising a titanium film and a titanium nitride film.

16. The method of claim 9, further comprising the step of:
    forming, on the silicon nitride film, a ferroelectric capacitor having a lower electrode connected to the contact plug.

* * * * *